United States Patent
Matsushige et al.

(10) Patent No.: US 8,335,116 B2
(45) Date of Patent: Dec. 18, 2012

(54) SEMICONDUCTOR STORAGE DEVICE

(75) Inventors: Muneaki Matsushige, Kanagawa (JP);
Atsunori Hirobe, Kanagawa (JP);
Kazutaka Kikuchi, Kanagawa (JP);
Tetsuo Fukushi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 168 days.

(21) Appl. No.: 13/014,510

(22) Filed: Jan. 26, 2011

(65) Prior Publication Data

US 2011/0188330 A1    Aug. 4, 2011

(30) Foreign Application Priority Data

Feb. 4, 2010  (JP) ................................. 2010-022976

(51) Int. Cl.
*G11C 7/00* (2006.01)
*G11C 8/00* (2006.01)
*G11C 8/16* (2006.01)

(52) U.S. Cl. ......... 365/189.05; 365/230.03; 365/230.08; 365/233.1; 365/233.13

(58) Field of Classification Search ............ 365/189.05, 365/230.03, 230.08, 233.1, 233.13
See application file for complete search history.

(56) References Cited

U.S. PATENT DOCUMENTS

| | | | | |
|---|---|---|---|---|
| 5,008,852 A * | 4/1991 | Mizoguchi | ............... | 365/230.03 |
| 5,202,852 A * | 4/1993 | Mizuta | ................... | 365/189.05 |
| 5,274,788 A * | 12/1993 | Koike | ................... | 365/230.03 |
| 5,369,618 A * | 11/1994 | Takasugi | ................ | 365/230.03 |
| 5,901,304 A * | 5/1999 | Hwang et al. | ............ | 365/189.05 |
| 5,931,927 A | 8/1999 | Takashima | | |
| 5,956,274 A * | 9/1999 | Elliott et al. | .............. | 365/189.05 |
| 6,075,728 A * | 6/2000 | Inoue et al. | ............. | 365/189.05 |
| 6,421,274 B1 * | 7/2002 | Yoshimura | ............... | 365/189.05 |
| 6,483,755 B2 * | 11/2002 | Leung et al. | ............. | 365/189.05 |
| 6,687,181 B2 * | 2/2004 | Usuki et al. | ............. | 365/230.03 |
| 6,813,192 B2 * | 11/2004 | Hwang et al. | ............ | 365/189.05 |
| 7,191,302 B2 * | 3/2007 | Usami | ..................... | 365/189.05 |
| 7,508,723 B2 * | 3/2009 | Goodwin et al. | ........ | 365/189.05 |
| 7,701,802 B2 * | 4/2010 | Vergnes et al. | ............ | 365/233.1 |
| 7,983,112 B2 * | 7/2011 | Haraguchi et al. | ........ | 365/233.13 |
| 8,054,699 B2 * | 11/2011 | Takahashi et al. | ....... | 365/189.05 |
| 2004/0032790 A1 | 2/2004 | Mori et al. | | |

FOREIGN PATENT DOCUMENTS

JP   09-251336 A   9/1997
JP   2004-079077 A   3/2004

* cited by examiner

*Primary Examiner* — Trong Phan
(74) *Attorney, Agent, or Firm* — Sughrue Mion, PLLC (57) ABSTRACT

A semiconductor storage device includes: a plurality of memory cell arrays; a plurality of bidirectional data buses provided in correspondence with respective ones of the plurality of memory cell arrays; a plurality of bidirectional buffer circuits, which are provided in correspondence with respective ones of the memory cell arrays, capable of connecting adjacent bidirectional data buses serially so as to relay data in the bidirectional data buses; and a control circuit for controlling activation of the bidirectional buffer circuits. The bidirectional buffer circuit is arranged so as to invert logic and the bidirectional buffer circuit is arranged so as not to invert logic.

8 Claims, 8 Drawing Sheets

H: ACTIVATED (SELECTED)
L: DEACTIVATED (DESELECTED)

H: ACTIVATED (SELECTED)
L: DEACTIVATED (DESELECTED)

SEMICONDUCTOR STORAGE DEVICE

REFERENCE TO RELATED APPLICATION

This application is based upon and claims the benefit of the priority of Japanese patent application No. 2010-022976, filed on Feb. 4, 2010, the disclosure of which is incorporated herein in its entirety by reference thereto.

TECHNICAL FIELD

This invention relates to a semiconductor storage device and, more particularly, to a technique for driving a data bus within a semiconductor storage device.

BACKGROUND

In recent years progress has been made in improving the performance of and increasing the storage capacity of semiconductor memories, and chip size has increased as well. This has been accompanied by an increase in data bus length within the chip and there is a tendency toward an increase in load for driving the data bus. Further, an increase in wiring capacitance and wiring resistance of the data bus results in a larger IR-drop, and delay increases as well. Consequently, unless some measures are taken with regard to the data bus, high-speed operation may be hindered owing to power supply noise ascribable to a drop in power supply voltage or the like.

A technique for reducing the influence of a data bus on a power supply is disclosed in Patent Document 1. Specifically, an input/output device described in Patent Document 1 is provided with a function for dividing an internal data line and an internal output circuit into n types of groups and deciding from m bits of data whether to inverter or not invert all internal data within each group. As a result, power supply noise ascribable to parasitic inductance of the power supply line when the output circuit is driven can be reduced and the data transfer rate raised.

Patent Document 2 discloses a semiconductor storage device in which, by inserting relay buffers in a data bus, data transfer can be speeded up without enlarging wiring width or wiring pitch of the data bus, and in which activation/deactivation of the relay buffer circuit is controlled by using, as is, a block selection signal for block activation. In accordance with such a semiconductor storage device, efficient buffer drive control is possible in relation to chip area and operating current.

[Patent Document 1]
Japanese Patent Kokai Publication No. JP-A-09-251336
[Patent Document 2]
Japanese Patent Kokai Publication No. JP-P2004-79077A

SUMMARY

The entire disclosure of Patent Documents 1 and 2 are incorporated herein by reference thereto.
The analysis set forth below is given in the present invention.
The input/output device described in Patent Document 1 has a determination circuit for determining a combination of data, and area for placing the determination circuit in the chip is required. Further, in order to maintain the phase of the data, a data inverting function is required also on the side of the communicating counterpart. This results in a complicated circuit configuration. On the other hand, since all relay buffers are driven in phase in the semiconductor storage device described in Patent Document 2, a large drop in power supply voltage occurs and this is an impediment to achieving a higher operating speed.

Thus there is much to be desired in the art.

According to a first aspect of the present invention there is provided a semiconductor storage device comprising: a plurality of memory cell arrays; a plurality of bidirectional data buses provided in correspondence with respective ones of the plurality of memory cell arrays; a plurality of bidirectional buffer circuits, which are provided in correspondence with respective ones of the plurality of memory cell arrays, capable of connecting adjacent bidirectional data buses serially so as to relay data in the bidirectional data buses; and a control circuit for exercising control in such a manner that in a case where a desired memory cell array is accessed, all bidirectional buffer circuits included in a path from the bidirectional data bus provided in correspondence with the desired memory cell array to an access source are activated in one direction in accordance with the access direction. Some of the plurality of bidirectional buffer circuits are arranged so as to invert logic, and the others are arranged so as not to invert logic.

The meritorious effects of the present invention are summarized as follows.

In accordance with the present invention, data buses can be driven at higher speed with almost no increase in circuit complexity.

Other features and advantages of the present invention will be apparent from the following description taken in conjunction with the accompanying drawings, in which like reference characters designate the same or similar parts throughout the figures thereof.

PREFERRED MODES

A semiconductor storage device according to an embodiment of the present invention comprises: a plurality of memory cell arrays 10 (FIG. 1); a plurality of bidirectional data buses 11 (FIG. 1) provided in correspondence with respective ones of the plurality of memory cell arrays; a plurality of bidirectional buffer circuits 12a, 12b (FIG. 1), which are provided in correspondence with respective ones of the memory cell arrays, capable of connecting adjacent bidirectional data buses serially so as to relay data in the bidirectional data buses; and a control circuit 13 (FIG. 1) for exercising control in such a manner that in a case where a desired memory cell array is accessed, all bidirectional buffer circuits included in a path from the bidirectional data bus provided in correspondence with the desired memory cell array to an access source are activated in one direction in accordance with the access direction; wherein some (bidirectional buffer circuits 12b in FIG. 1) of the plurality of bidirectional buffer circuits are arranged so as to invert logic and the others (bidirectional buffer circuits 12a in FIG. 1) are arranged so as not to invert logic.

In the semiconductor storage device, the plurality of bidirectional buffer circuits may be arranged in such a manner that a circuit section (which corresponds to bidirectional buffer circuit 12b in FIG. 1) based upon inversion of logic and a circuit section based upon non-inversion of logic (which corresponds to bidirectional buffer circuit 12a in FIG. 1) are disposed alternately on the path.

In the semiconductor storage device, it is preferred that the control circuit exercise control in such a manner that a bidirectional buffer circuit(s) not included in the path is (are) deactivated.

In the semiconductor storage device, it is preferred that the control circuit exercise control in such a manner that, in a case where the desired memory cell array is written, all bidirectional buffer circuits included in the path are activated in a direction from the access source to the desired memory cell array, and in a case where the desired memory cell array is read, all bidirectional buffer circuits included in the path are activated in a direction from the desired memory cell array to the access source.

In the semiconductor storage device, it is preferred that each of the bidirectional buffer circuits has first and second buffer circuits whose inputs and outputs are mutually connected. The control circuit may deactivate both the first and second buffer circuits in a case where the bidirectional buffer circuit is deactivated, and activate only either one of the first and second buffer circuits in accordance with the access direction in a case where the bidirectional buffer circuit is activated.

In accordance with the semiconductor storage device described above, the load upon the driver can be reduced and operation performed at higher speed by providing the data buses with the bidirectional buffer circuits and driving the data buses is divided fashion. In this case, the range over which data buses are driven is limited to the minimum necessary by using address-space selection logic in controlling activation of the bidirectional buffer circuits.

Further, by inverting data using some of the bidirectional buffer circuits, charge/discharge current in a series of data buses can be decreased and IR-drop reduced. Specifically, in a case where data is not inverted by any of the bidirectional buffer circuits at a certain timing, only one of charge and discharge occurs in the data bus. By contrast, when it is so arranged that data is inverted by some of the bidirectional buffer circuits, charging and discharging are combined in the data bus and current consumption is reduced. As a result, IR-drop is reduced and operation at higher speed becomes possible.

It should be noted that the data buses are bidirectional buses and perform data inversion and buffering is similar fashion also when data is read out. It is possible for data written to a memory cell to be read out without particularly needing to take note as to whether or not data inversion has taken place. This effect manifests itself especially in the circuit arrangement within the chip.

It should be noted that reference to the symbols shown in the drawings mentioned in the description of preferred modes is not intended to be limitative to those disclosed in the drawings. Such reference to the symbols are presented merely for better illustration.

A preferred embodiment of the present invention will now be described in detail with reference to the drawings.

First Exemplary Embodiment

Figure 1:
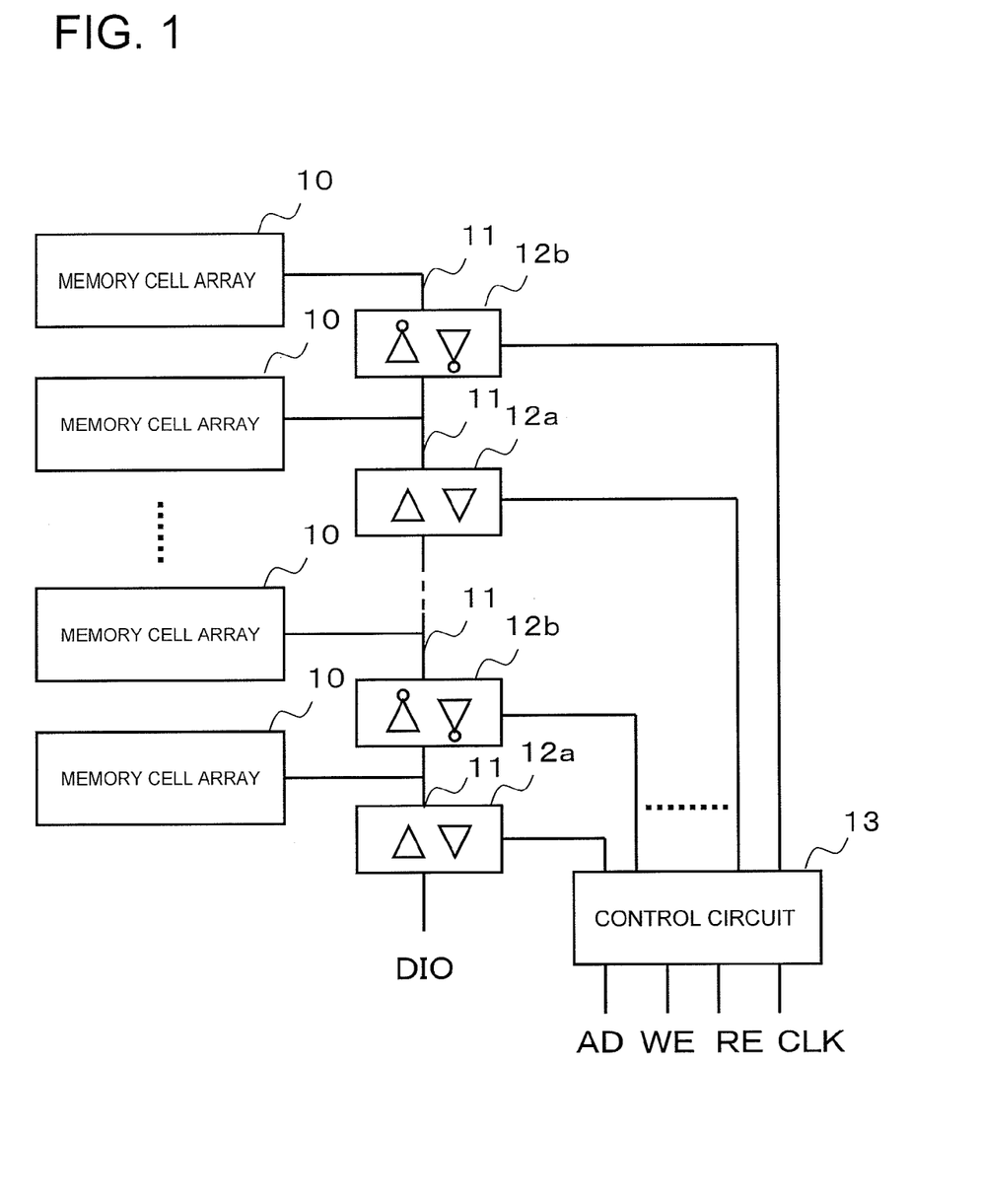
FIG. 1 is a block diagram illustrating the configuration of a semiconductor storage device according to a First exemplary embodiment of the present invention.

FIG. 1 is a block diagram illustrating the configuration of a semiconductor storage device according to a First exemplary embodiment of the present invention. As shown in FIG. 1, the semiconductor storage device comprises: a plurality of memory cell arrays 10; a plurality of bidirectional data buses 11 provided in correspondence with respective ones of the plurality of memory cell arrays 10; a plurality of bidirectional buffer circuits 12a, 12b, which are provided in correspondence with respective ones of the memory cell arrays 10, capable of connecting adjacent bidirectional data buses 11 serially so as to relay data in the bidirectional data buses; and a control circuit 13 for controlling activation of the bidirectional buffer circuits 12a, 12b.

In a case where a desired memory cell array 10 is accessed, the control circuit 13 exercises control in such a manner that all bidirectional buffer circuits 12a, 12b included in the path from the bidirectional data bus 10 provided in correspondence with the desired memory cell array 10 to an access source will be activated in one direction in accordance with the access direction. For example, in a case where the desired memory cell array is written, control is exercised so that all bidirectional buffer circuits included in the path are activated in the direction from the access source to the desired memory cell array. Further, in a case where a desired memory cell array is read out, control is exercised so that all bidirectional buffer circuits included in the path are activated in the direction from the desired memory cell to the access source. In this case, it is preferred that the control circuit 13 exercise control so as to deactivate bidirectional buffer circuits not included in the above-mentioned path.

More specifically, the inputs to the control circuit 13 are an address signal AD, a write-enable signal WE, a read-enable signal RE and a clock signal CLK for operation of the memory cell arrays 10. If the write-enable signal WE or read-enable signal RE is active, the control circuit 13 exercises control in synch with the clock signal CLK so as to activate, in one direction, all of the bidirectional buffer circuits 12a, 12b included in the path leading to the access source from the bidirectional data bus 11 connected to the memory cell array 10 designated by the address signal AD. If the write-enable signal WE is active, then the control circuit 13 exercises control so as to activate the bidirectional buffer circuits 12a, 12b in the direction from the access source to the memory cell array 10 designated by the address signal AD and write a data signal DIO to the desired memory cell array 10. If the read-enable signal RE is active, then the control circuit 13 activates the bidirectional buffer circuits 12a, 12b in the direction from the memory cell array 10 designated by the address signal AD to the access source and makes it possible to output externally the signal, which has been read out of the desired memory cell array 10, as the data signal DIO.

Some of the plurality of bidirectional buffer circuits 12a, 12b, namely the bidirectional buffer circuits 12b, are arranged so as to invert logic, and the others, namely the bidirectional buffer circuits 12a, are arranged so as not to invert logic. In this case, the bidirectional buffer circuit 12a and the bidirectional buffer circuit 12b, for example, may be arranged so as to be disposed alternately on the path.

Figure 2:
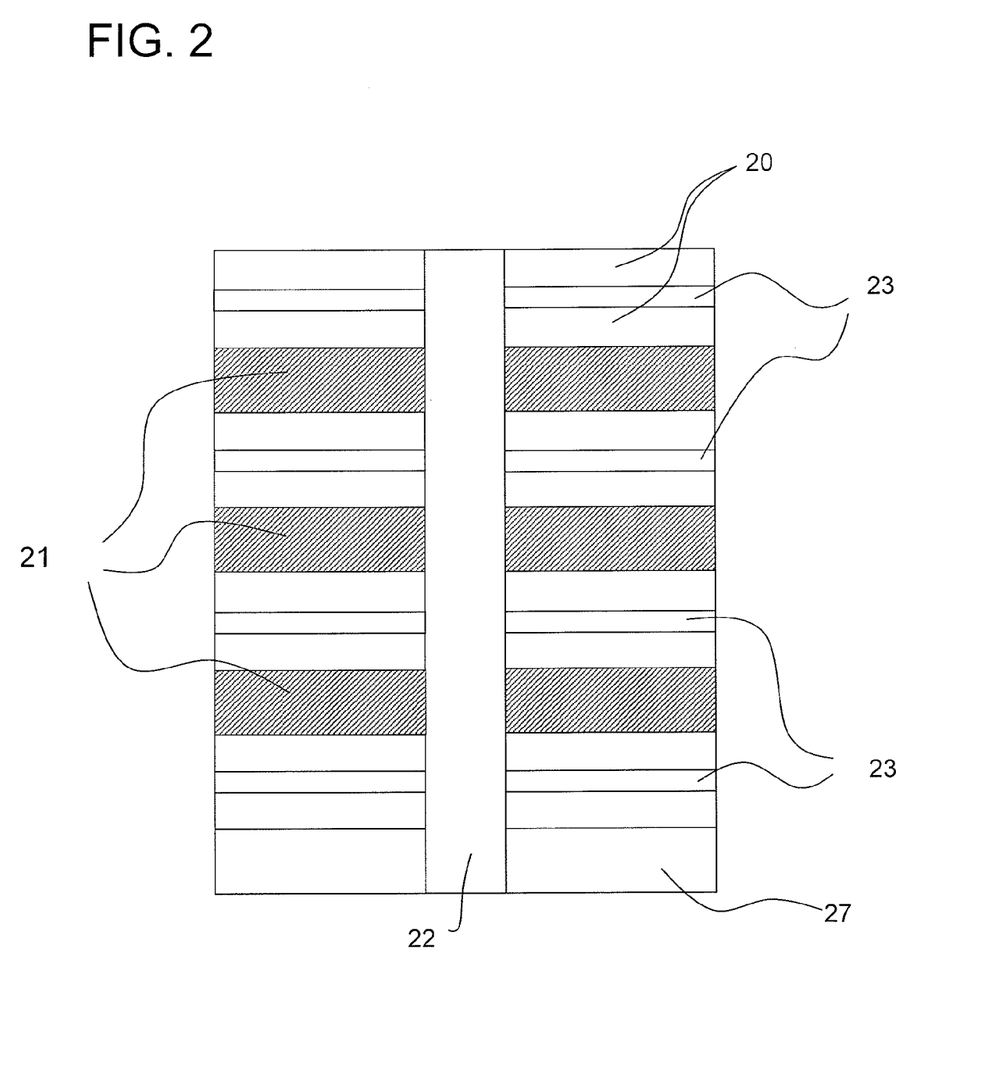
FIG. 2 is a diagram schematically illustrating the layout of a semiconductor storage device according to a First exemplary embodiment of the present invention.

FIG. 2 is a diagram schematically illustrating the layout of a semiconductor storage device according to a First exemplary embodiment of the present invention. As shown in FIG. 2, reference numeral 20 denotes areas in which memory cell arrays 10, sense amplifiers and Y switches are placed, reference numeral 21 denotes areas in which bidirectional buffer circuits 12a, 12b are placed, reference numeral 22 denotes an area in which a row decoder, address command controller and control circuit 13 are placed, reference numeral 23 denotes areas in which column decoders, write amplifiers (which correspond to write amplifiers Aw1, Aw2, described later) and data amplifiers (which correspond to read amplifiers Ad1, Ad2, described later) are placed, and reference numeral 27 denotes areas in which a data I/O for external interfacing is placed.

It should be noted that the way in which column and row addresses are applied in memory cell array 10, the sense amplifiers, the Y switches, the column decoders, the data I/O and timing control, etc., have no bearing upon the present invention and are not described here.

As mentioned above, the semiconductor storage device according to this embodiment is characterized by the following three means:

(1) bidirectional buffer circuits are provided at points along the data bus to divide up and drive the data bus;

(2) activation of required bidirectional buffer circuits is controlled based upon address-space selection logic, and the range over which data buses are driven is rendered selectable; and (3) data is inverted by some of the bidirectional buffer circuits.

The load on the driver that drives the data buses and the IR-drop are reduced by these three means. More specifically, in accordance with (1), wiring driven by the driver is shortened and driver load is reduced. In accordance with (2), the range over which data buses are driven is limited so that consumed current can be reduced. In accordance with (3), charging and discharging in the data buses are combined to thereby reduce current consumption as well as IR-drop.

Next, in order to simplify the description, the embodiment will be described in detail taking as an example a case where there are two memory cell arrays.

Figure 3A:
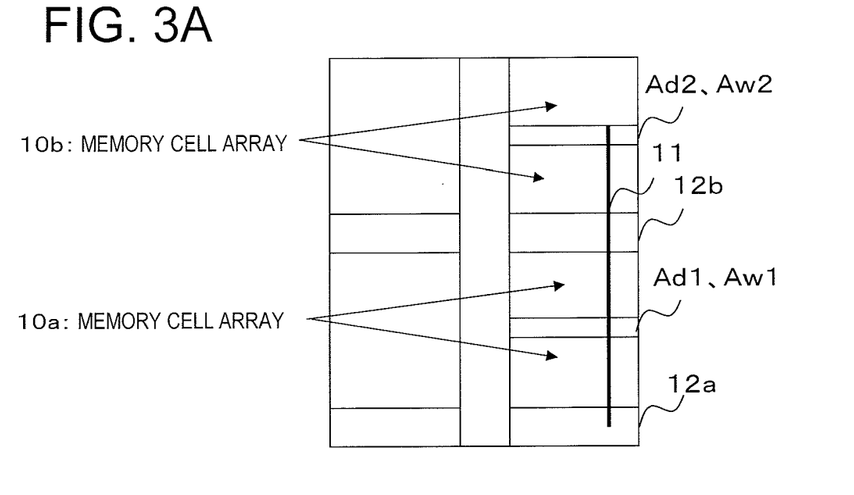
FIGS. 3A and 3B are a diagram representing chip structure and a circuit diagram illustrating the details of data buses, respectively, in a case where there are two memory cell arrays.
Figure 3B:
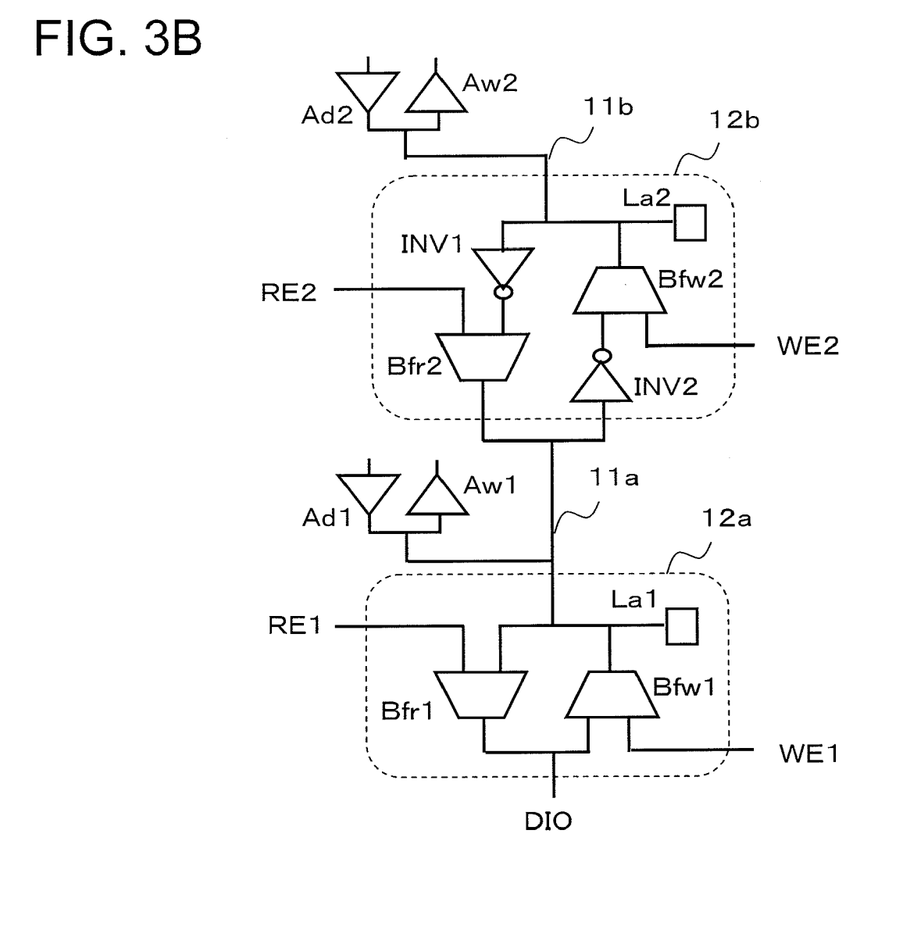

FIG. 3A is a diagram schematically illustrating chip structure in case of two memory cell arrays, and FIG. 3B is a circuit diagram illustrating the details of data buses in FIG. 3A.

In FIG. 3A, memory cell arrays 10a, 10b are placed below and above, respectively, the central portion of the chip on the right side thereof, and a circuit relating to bidirectional data bus 11 is provided. Bidirectional buffer circuit 12a relating to the memory cell arrays 10a, and write amplifier Aw1 and read amplifier (data amplifier) Ad1 relating to memory cell array 10a are disposed on the lower right side of the chip. Bidirectional buffer circuit 12b relating to the memory cell array 10b, and write amplifier Aw2 and read amplifier (data amplifier) Ad2 relating to memory cell array 10b are disposed on the upper right side of the chip.

In FIG. 3B, the circuit relating to bidirectional data bus 11 has the bidirectional buffer circuits 12a, 12b, the write amplifiers Aw1, Aw2 and the read amplifiers Ad1, Ad2, and the bidirectional data bus 11 is divided into two bidirectional data buses 11a, 11b.

The bidirectional buffer circuit 12a has buffer circuits Bfw1, Bfr1 and a latch circuit La1. The buffer circuit Bfw1 is activated by a write-enable signal WE1. If the write-enable signal WE1 is active, the buffer circuit Bfw1 buffers the data signal DIO and drives the bidirectional data bus 11a. If the write amplifier Aw1 is active, the signal on the bidirectional data bus 11a is written to the memory cell array 10a. If the read amplifier Ad1 is active, the bidirectional data bus 11a is driven by the signal that has been read out of the memory cell array 10a. If the read-enable signal RE1 is active, the buffer circuit Bfr1 buffers the signal on the bidirectional data bus 11a and outputs the signal externally as the data signal DIO. The latch circuit La1 functions so as to maintain the signal level on the bidirectional data bus 11a in such a manner that the bidirectional data bus 11a will not attain a floating state in a case where the buffer circuits Bfw1, Bfr2 and read amplifier Ad1 are not active, and so as to maintain the signal level on the bidirectional data bus 11a or data from the memory cell array 10a in a case where the buffer circuits Bfw1, Bfr2 and read amplifier Ad1 are active.

The write-enable signal WE1 is generated in the control circuit 13 of FIG. 1 from the write-enable signal WE and clock signal CLK. If the write-enable signal WE is active, the write-enable signal WE1 is activated based upon the timing of the clock signal CLK. The read-enable signal RE1 is generated in the control circuit 13 of FIG. 1 from the read-enable signal RE and clock signal CLK. If the read-enable signal RE is active, the read-enable signal RE1 is activated based upon the timing of the clock signal CLK.

The bidirectional buffer circuit 12b has buffer circuits Bfw2, Bfr2, inverter circuits INV1, IV2, and a latch circuit La2. The buffer circuit Bfw2 is activated by a write-enable signal WE2. If the write-enable signal WE2 is active, the buffer circuit Bfw2 buffers the signal on the bidirectional data bus 11a upon inverting its logic by the inverter INV2 and drives the bidirectional bus 11b. If the write amplifier Aw2 is active, the signal on the bidirectional data bus 11b is written to the memory cell array 10b. If the read amplifier Ad2 is active, the bidirectional data bus 11b is driven by the signal that has been read out of the memory cell array 10b. If the read-enable signal RE2 is active, the buffer circuit Bfr2 buffers the signal on the bidirectional data bus 11b upon inverting its logic by the inverter INV1 and outputs the resultant signal as a signal on the bidirectional data bus 11a. The latch circuit La2 functions so as to maintain the signal level on the bidirectional data bus 11b in such a manner that the bidirectional data bus 11b will not attain a floating state in a case where the buffer circuit Bfw2 and read amplifier Ad2 are not active, and so as to maintain the signal level on the bidirectional data bus 11b or data from the memory cell array 10b in a case where the buffer circuit Bfw2 is active.

The write-enable signal WE2 is generated in the control circuit 13 of FIG. 1 from the write-enable signal WE, address signal AD and clock signal CLK. If the write-enable signal WE becomes active and the address signal AD points to the memory cell array 10b, the write-enable signal WE2 is activated based upon the timing of the clock signal CLK. The read-enable signal RE2 is generated in the control circuit 13 of FIG. 1 from the read-enable signal RE, address signal AD and clock signal CLK. If the read-enable signal RE becomes active and the address signal AD points to the memory cell array 10b, the read-enable signal RE2 is activated based upon the timing of the clock signal CLK.

Figure 4:
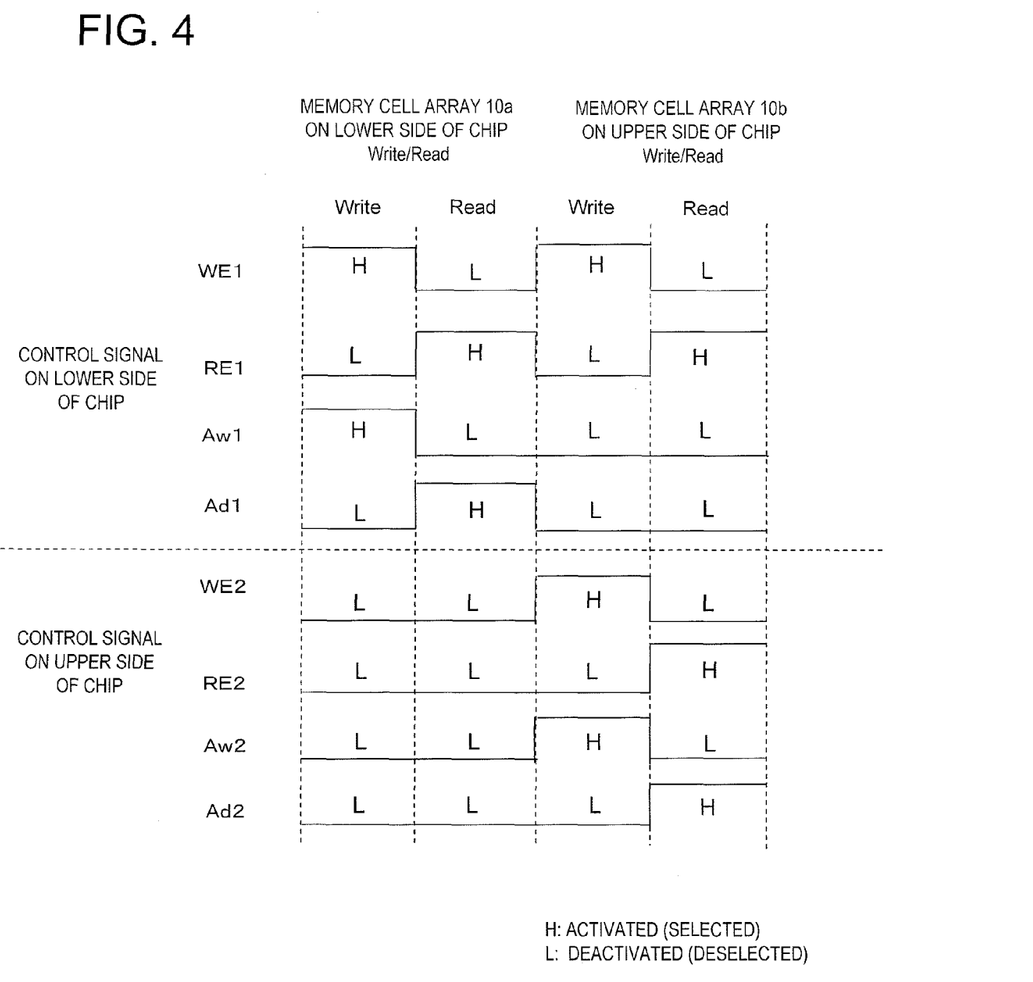
FIG. 4 is a level chart of a control signal when a chip is accessed in a case where there are two memory cell arrays.

Operation when memory cell arrays are read and written will be described next. FIG. 4 is a level chart of a control signal when a chip is accessed in a case where there are two memory cell arrays.

In FIG. 4, first consider a case where memory cell array 10a on the lower side of the chip is accessed. If the operation is the write operation, the write-enable signal WE1 is placed at the H level (the activated state, which is the selected state) and the read-enable signal RE1 is placed at the L level (the deactivated state, which is the deselected state). Further, the write amplifier Aw1 is placed at the H level and the read amplifier (data amplifier) Ad1 is placed at the L level. Furthermore, write-enable signal WE2, read-enable signal RE2, write amplifier Aw2 and read amplifier (data amplifier) Ad2 relating to the memory cell array 10b on the upper side of the chip are all placed in the deactivated (deselected) state.

If the operation is the read operation, the write-enable signal WE1 is placed at the L level (the deactivate state, which is the deselected state) and the read-enable signal RE1 is placed at the H level (the activated state, which is the selected state). Further, the write amplifier Aw1 is placed at the L level and the read amplifier (data amplifier) Ad1 is placed at the H level. Furthermore, write-enable signal WE2, read-enable signal RE2, write amplifier Aw2 and read amplifier (data amplifier) Ad2 relating to the memory cell array 10b on the upper side of the chip are all placed in the deactivated (deselected) state.

On the other hand, consider a case where memory cell array 10b on the upper side of the chip is accessed. If the operation is the write operation, the write-enable signals WE1, WE2 are placed at the H level (the activated state, which is the selected state) and the read-enable signals RE1, RE2 are placed at the L level (the deactivated state, which is the deselected state). Further, the write amplifier Aw2 is placed at the H level and the write amplifier Aw1 and read amplifiers Ad1, Ad2 are placed at the L level.

If the operation is the read operation, the write-enable signals WE1, WE2 are placed at the L level (the deactivated state, which is the deselected state) and the read-enable signals RE1, RE2 are placed at the H level (the activated state, which is the selected state). Further, the read amplifier Ad2 is placed at the H level and the write amplifiers Aw1, Aw2 and read amplifiers Ad1 are placed at the L level.

Figure 5A:
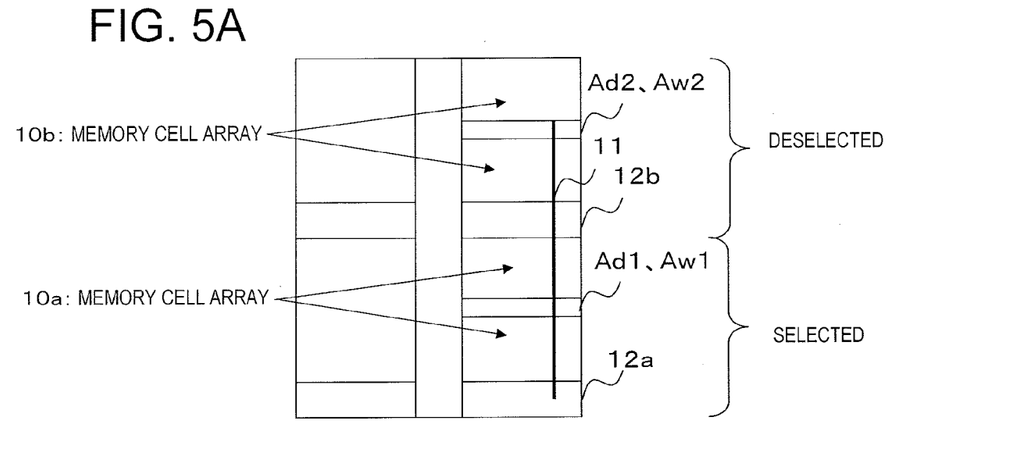
FIGS. 5A and 5B are diagrams illustrating range of activation in a case where a memory cell array on the lower side of a chip is accessed in FIG. 2.
Figure 5B:
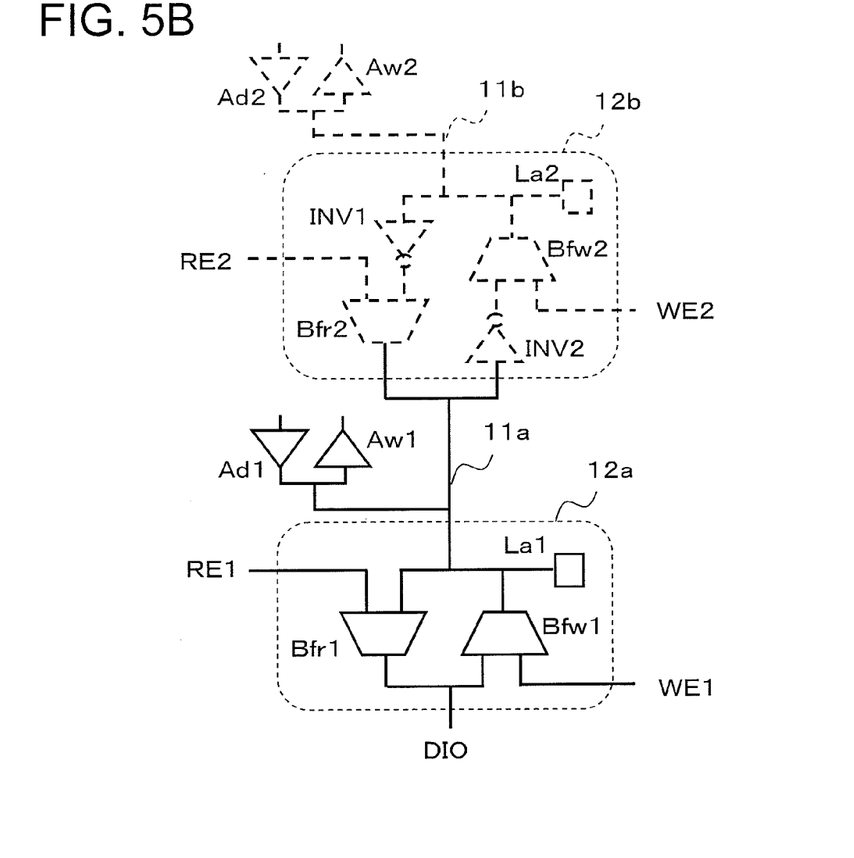

FIGS. 5A and 5B are diagrams illustrating range of activation in a case where memory cell array 10a on the lower side of a chip is accessed in FIG. 3.

In a case where data is written to or read from the memory cell array 10a on the lower side, what is ahead of the bidirectional buffer circuit 12b is deactivated (indicated by the dashed line) by address-space selection logic and driving of the bidirectional bus 11b, the operation of which is unnecessary, is halted. Current consumption is reduced as a result. In addition, an increase in the speed of data transmission can be expected.

Figure 6:
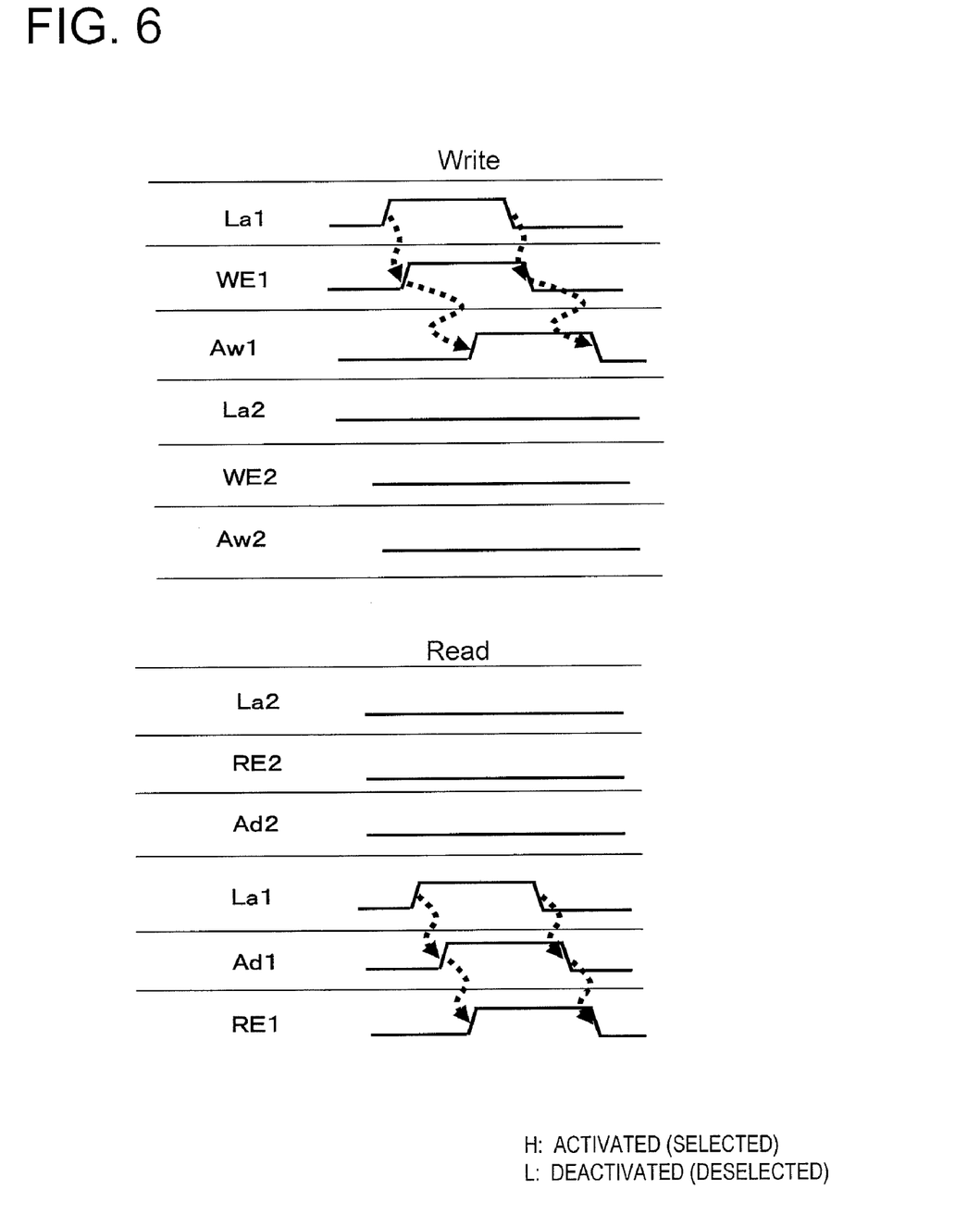
FIG. 6 is a timing chart in a case where a memory cell array on the lower side of a chip is accessed.

FIG. 6 is a timing chart in a case where memory cell array 10a on the lower side of a chip is accessed. At the time of the write operation, the latch circuit La1 is released, the write-enable signal WE1 is activated and data is transmitted to the bidirectional data bus 11a. The write amplifier Aw1, which has been selected by the address signal, is activated and data is written to the memory cell array 10a.

At the time of the read operation, the read amplifier Ad1, which has been selected by the address signal, is activated after the latch circuit La1 is released, and data is transmitted to the bidirectional data bus 11a. Next, data is output externally by the read-enable signal RE1.

By contrast, at the time of writing and reading of the memory cell array 10a, the latch circuit La2 latches and none of the write-enable signal WE2, write amplifier Aw2, read-enable signal RE2 and read amplifier Ad2 are activated.

Figure 7A:
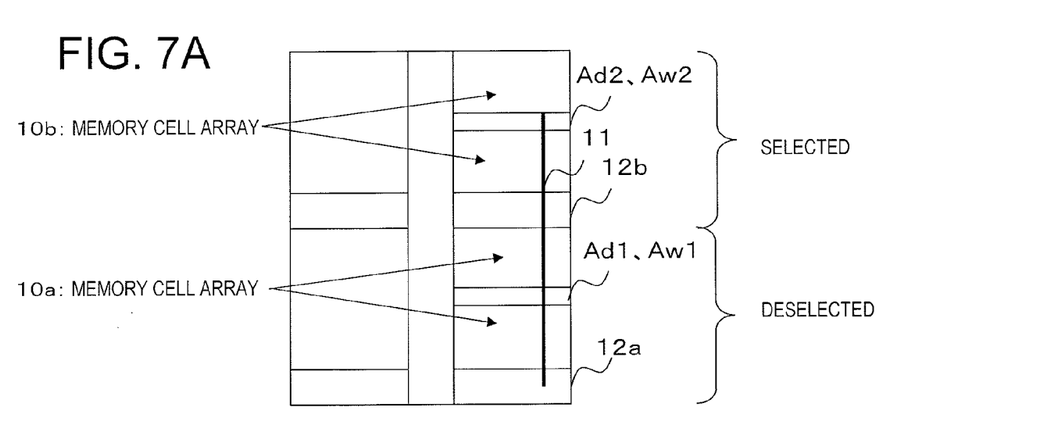
FIGS. 7A and 7B are diagrams illustrating range of activation in a case where a memory cell array on the upper side of a chip is accessed in FIG. 2.
Figure 7B:
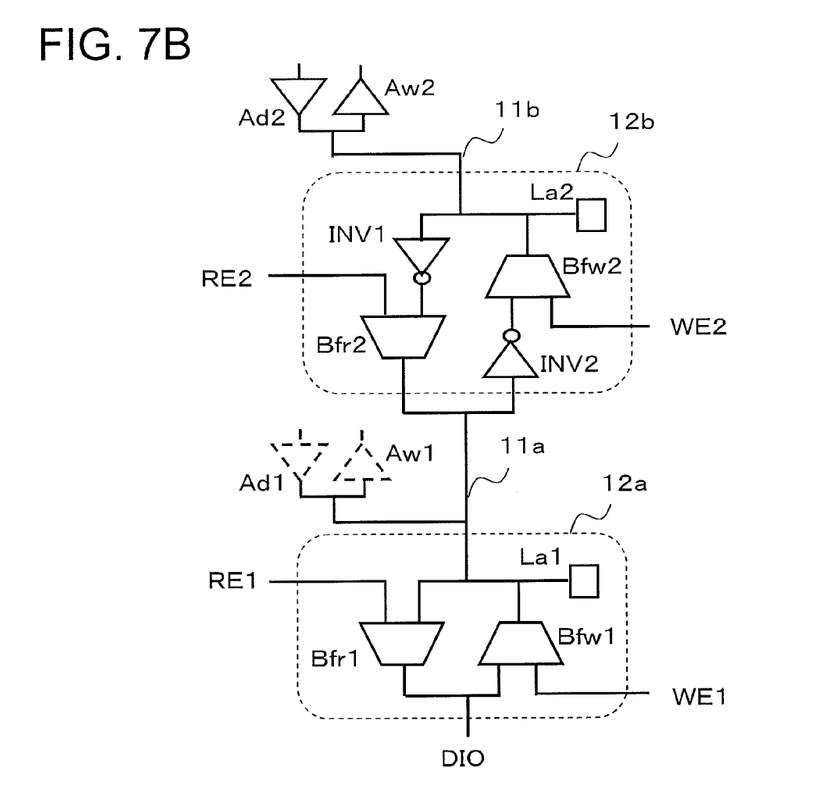

FIGS. 7A and 7B are diagrams illustrating range of activation in a case where memory cell array 10b on the upper side of a chip is accessed in FIG. 3. In FIGS. 7A and 7B, everything is activated with the exception of the write amplifier Aw1 and read amplifier Ad1. In this case, in comparison with the case of FIGS. 5A and 5B, the data bus comprising the bidirectional data buses 11a, 11b is substantially longer and, hence, there is the danger that the IR-drop will increase. Accordingly, the bidirectional buffer circuit 12b having the data inverting function is activated to thereby suppress an increase in IR-drop.

Figure 8:
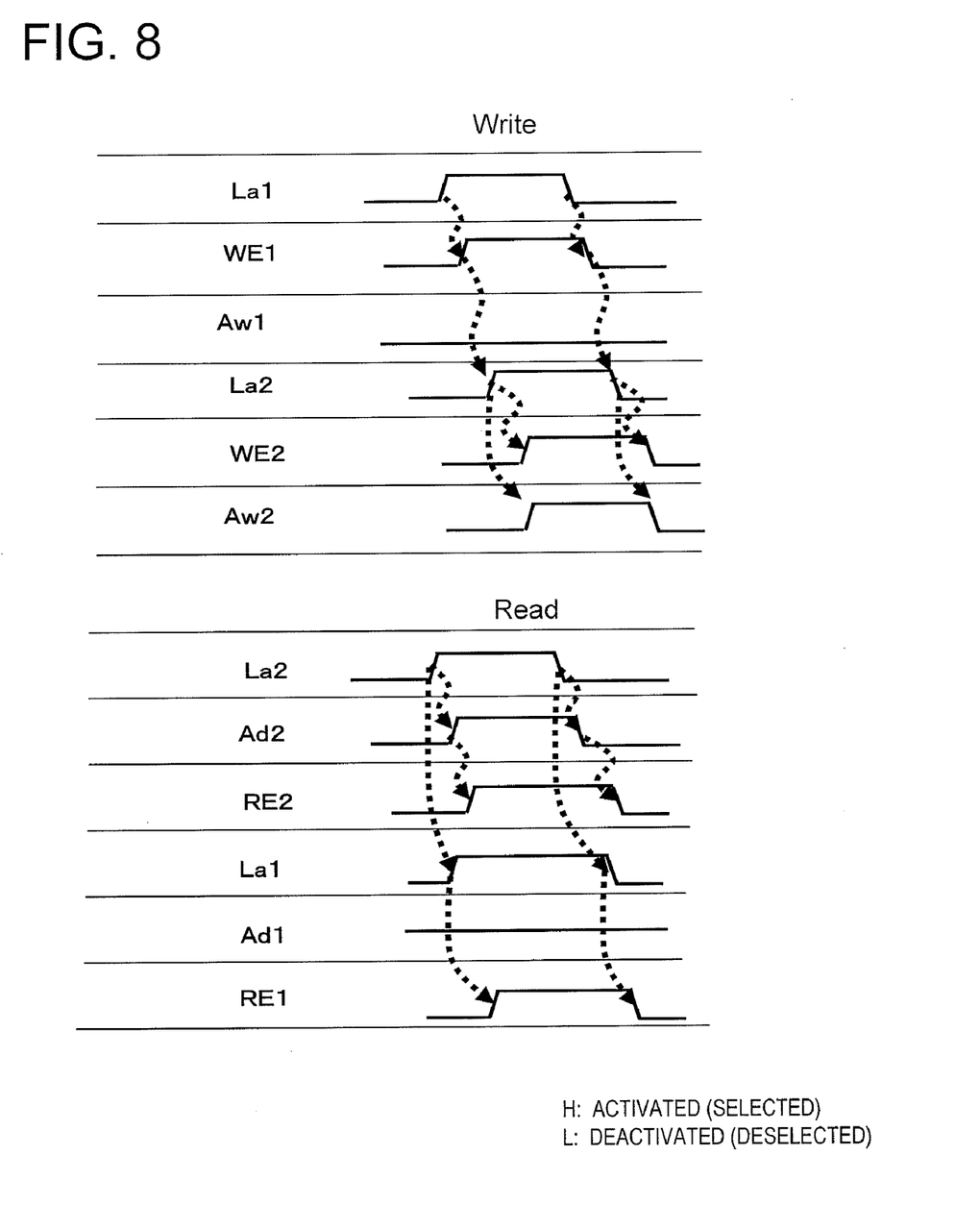
FIG. 8 is a timing chart in a case where a memory cell array on the upper side of a chip is accessed.

FIG. 8 is a timing chart in a case where memory cell array 10b on the upper side of a chip is accessed. At the time of the write operation, the write-enable signal WE1 is activated after the latch circuit La1 is released, and data is transmitted to the bidirectional data bus 11a. Next, the latch circuit La2 is released, the write-enable signal WE2 is activated and data is transmitted to the bidirectional bus 11b on the upper side. The write amplifier Aw2, which has been selected by the address signal, is activated and data is written to the desired memory cell array 10b.

At the time of the read operation, the read amplifier Ad2 selected by the address signal is activated and the bidirectional bus 11b is driven after the latch circuit La2 is released. The latch circuit La1 is then released, the read-enable signal RE2 is activated and data is transmitted to the bidirectional data bus 11a on the lower side. The read-enable signal RE1 is activated and data is output externally.

Thus, as described above, bidirectional buffer circuits that divide a data bus disposed within a memory are disposed within the device, and control for activating the bidirectional buffer circuits in one direction is carried out in conformity with read-amplifier control and write-amplifier control. Further, the bidirectional buffer circuits are controlled in such a manner that the minimum data buses necessary are driven selectively by the address signal AD. Load can be alleviated and high speed achieved by exercising such control.

Furthermore, by inverting data in some of the bidirectional buffer circuits, charging and discharging of current for signal transmission is reduced and an increase in IR-drop is suppressed. In this case, the conventional determination circuit that renders a judgment for inverting data is no longer necessary and matching of specifications with those of a communicating party also is unnecessary.

The disclosures of the patent documents cited above are incorporated by reference in this specification. Within the bounds of the full disclosure of the present invention (inclusive of the scope of the claims), it is possible to modify and adjust the modes and embodiments of the invention based upon the fundamental technical idea of the invention. Multifarious combinations and selections of the various disclosed elements are possible within the bounds of the scope of the claims of the present invention. That is, it goes without saying that the invention covers various modifications and changes that would be obvious to those skilled in the art within the scope of the claims.

What is claimed is:

1. A semiconductor storage device, comprising:
a plurality of memory cell arrays;
a plurality of bidirectional data buses provided in correspondence with respective ones of said plurality of memory cell arrays;
a plurality of bidirectional buffer circuits, which are provided in correspondence with respective ones of said plurality of memory cell arrays, capable of connecting adjacent bidirectional data buses serially so as to relay data in said bidirectional data buses; and
a control circuit for exercising control in such a manner that in a case where a desired memory cell array is accessed, all bidirectional buffer circuits included in a path from the bidirectional data bus provided in correspondence with said desired memory cell array to an access source are activated in one direction in accordance with the access direction;

wherein some of said plurality of bidirectional buffer circuits are arranged so as to invert logic and the others are arranged so as not to invert logic.

2. The device according to claim 1, wherein said plurality of bidirectional buffer circuits are arranged in such a manner that a circuit section based upon inversion of logic and a circuit section based upon non-inversion of logic are disposed alternately on the path.

3. The device according to claim 1, wherein said control circuit exercises control in such a manner that a bidirectional buffer circuit(s) not included in the path is (are) deactivated.

4. The device according to claim 1, wherein said control circuit exercises control in such a manner that, in a case where the desired memory cell array is written, all bidirectional buffer circuits included in the path are activated in a direction from the access source to said desired memory cell array, and in a case where the desired memory cell array is read, all bidirectional buffer circuits included in the path are activated in a direction from said desired memory cell array to the access source.

5. The device according to claim 3, wherein said control circuit exercises control in such a manner that, in a case where the desired memory cell array is written, all bidirectional buffer circuits included in the path are activated in a direction from the access source to said desired memory cell array, and in a case where the desired memory cell array is read, all bidirectional buffer circuits included in the path are activated in a direction from said desired memory cell array to the access source.

6. The device according to claim 1, wherein each of said bidirectional buffer circuits has first and second buffer circuits whose inputs and outputs are mutually connected;

wherein said control circuit deactivates both said first and second buffer circuits in a case where said bidirectional buffer circuit is deactivated, and activates only either one of said first and second buffer circuits in accordance with the access direction in a case where said bidirectional buffer circuit is activated.

7. The device according to claim 3, wherein each of said bidirectional buffer circuits has first and second buffer circuits whose inputs and outputs are mutually connected;

wherein said control circuit deactivates both said first and second buffer circuits in a case where said bidirectional buffer circuit is deactivated, and activates only either one of said first and second buffer circuits in accordance with the access direction in a case where said bidirectional buffer circuit is activated.

8. The device according to claim 4, wherein each of said bidirectional buffer circuits has first and second buffer circuits whose inputs and outputs are mutually connected;

wherein said control circuit deactivates both said first and second buffer circuits in a case where said bidirectional buffer circuit is deactivated, and activates only either one of said first and second buffer circuits in accordance with the access direction in a case where said bidirectional buffer circuit is activated.

\* \* \* \* \*